United States Patent [19]
Lin

[11] Patent Number: 5,514,036
[45] Date of Patent: May 7, 1996

[54] DISK DRIVE WITHIN A CABINET, WITH A FILTER ELEMENT STRUCTURE

[75] Inventor: Chun-sung Lin, Shu Lin Town, Taiwan

[73] Assignee: Macase of Georgia, Inc., Norcross, Ga.

[21] Appl. No.: 287,655

[22] Filed: Aug. 9, 1994

[51] Int. Cl.⁶ .................................................. H05K 7/20
[52] U.S. Cl. ............................ 454/184; 55/471; 55/506; 55/507; 361/695
[58] Field of Search ........................ 55/467, 471, 492, 55/501, 506, 507; 454/184; 361/692, 693, 695

[56] References Cited

U.S. PATENT DOCUMENTS

| | | | |
|---|---|---|---|
| 2,976,796 | 3/1961 | Anthony et al. | 55/507 X |
| 4,126,269 | 11/1978 | Bruges | 361/695 X |
| 4,751,872 | 6/1988 | Lawson, Jr. | 361/695 X |
| 4,889,542 | 12/1989 | Hayes | 55/471 X |
| 5,236,478 | 8/1993 | Lewis et al. | 55/492 X |

FOREIGN PATENT DOCUMENTS 294597  10/1992  Japan ................................ 361/695

Primary Examiner—Harold Joyce
Attorney, Agent, or Firm—Needle & Rosenberg

[57] ABSTRACT

A filter element is placed in front of the air intake opening of an electronics cabinet such that all air drawn into the enclosure of the cabinet passes through the filter element. A fan is mounted such that all intake air is drawn only through the air intake opening and the filter. The filter element is removable from the enclosure for easy cleaning.

5 Claims, 1 Drawing Sheet

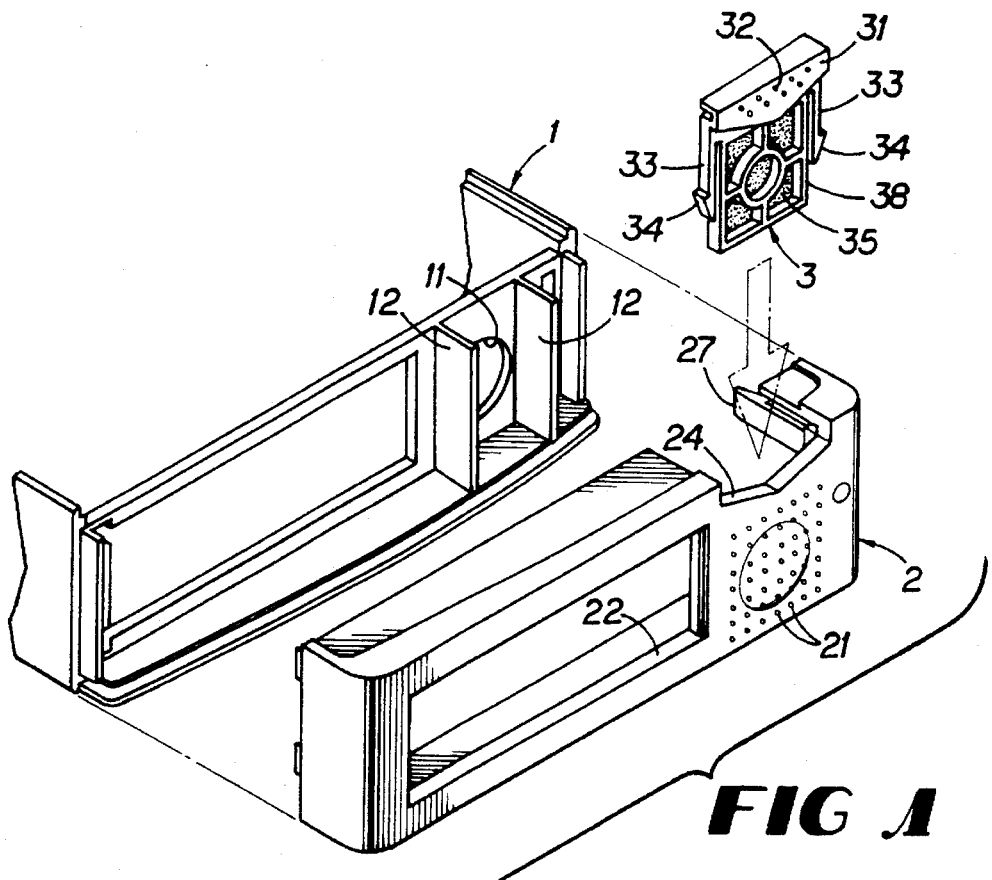
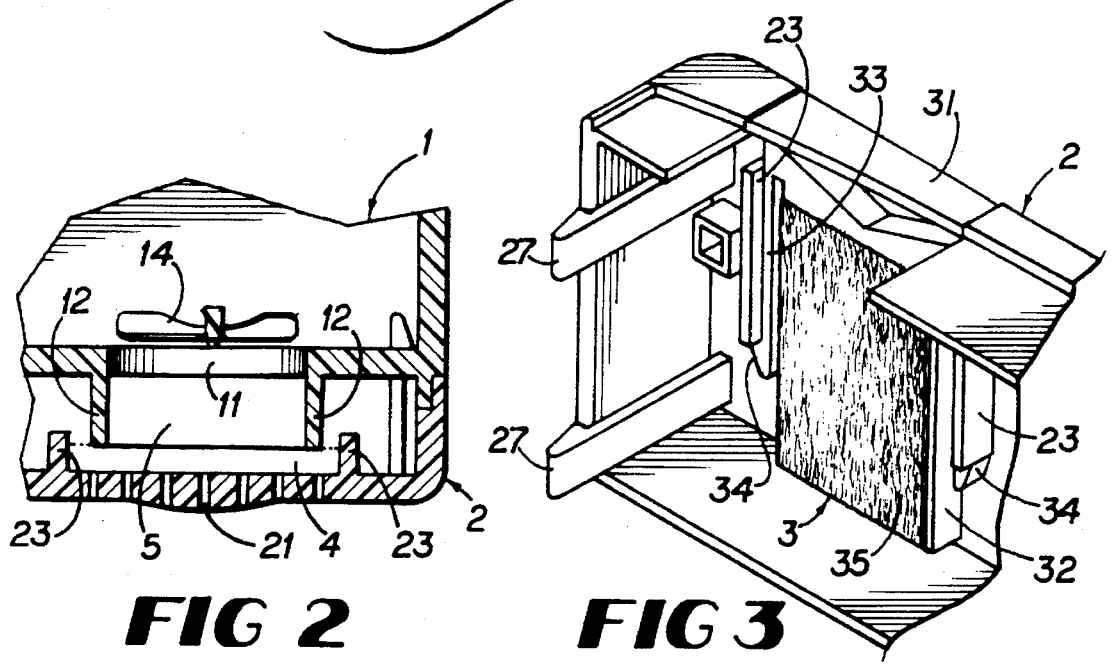

5,514,036

DISK DRIVE WITHIN A CABINET, WITH A FILTER ELEMENT STRUCTURE

BACKGROUND OF THE INVENTION

1. Field of the Invention

The present invention relates to a filter element for the ventilation system of an electronics enclosure and, more particularly, to a removable filter element for the ventilation system used to cool a disk drive.

2. Description of the Prior Art

Ventilation devices in computers, including those with internal disk drives, and external disk drive cabinets commonly use rotating fans to circulate air around heat producing electronic components. The circulated air carries away heat created by the electronic components, thus enabling the computers and disk drives to function properly.

There are many small dust particles and impurities in the air, some of which contain highly conductive materials. The build-up of a large quantity of accumulated conductive materials can lead to a breakdown of the computer or disk drive due to short-circuits. The accumulation of dust and impurities can also damage a reading head or diskette in the disk drive by dust-induced friction. This results in an abnormal readout, the inability to read, or even damage to the disk drive. Dust and impurities in the air have a great impact on computers and disk drives.

The commonly known ventilation methods use a fan to bring air inside the computer or disk drive. Usually, such a fan draws air into the case from all openings, exhausting the air at the location of the fan. This method quickens the rate at which dust and impurities in the air accumulate inside a computer or disk drive. The harmful effects may not be obvious when a computer is used only for a short period of time. However, after it has been used for some time, a layer of dust and impurities will accumulate on the disk drive or computer. If this layer is not removed, it may have serious effects.

Not all computer users are capable of cleaning the inside of a computer or a disk drive. One reason for this is that there are positioned cable pins inside a computer or a disk drive. If a pin comes off by accident while the user is cleaning the inside of the system and it is put back in the wrong place, the computer or disk drive may be damaged and may even completely lose its ability to function.

Therefore, there is a need to remove dust particles from the ventilation air of computer systems and disk drives while allowing maximal air flow through the system.

SUMMARY OF THE INVENTION

The present invention provides a filter element structure for removing particles from cooling air used an electronics enclosure. The filter element is inserted in the air circulation path of a computer or external disk drive to filter out dust and other impurities. It greatly reduces the harmful effects of dust accumulation created by the commonly used air ventilation methods.

The present invention comprises an electronics enclosure (of the type that would house a computer and/or a disk drive) and a filter element structure, wherein the filter element traps dust and impurities in the air to prevent them from entering the inside of the enclosure, thus avoiding the accumulation of dust inside. It features a filter unit placed immediately in front of the intake side of a fan in the electronics enclosure. The fan is located at the air intake of the enclosure so that the in-line filter will filter all incoming air. The filter is thus in the air circulation path between the air intake and the electronic and electro-mechanical components inside the enclosure. This prevents the accumulation of dirt on the inside, which causes damage to the disk drive. It also assists in prolonging the service life of the disk drive.

Filtering the ventilation air removes the dust particles. However, as filter elements remove dust from the air, they become clogged and the volume of air flow is reduced. Reducing the air flow reduces the heat transfer out of the enclosure which, in turn, increases the probability of heat damage to the system. To alleviate this problem, the filter in the ventilation system may be periodically cleaned. However, an affixed filter in an electronics cabinet is hard to remove and clean. Therefore, the filter element of the present invention may be mounted on an easily removed frame. The filter element can then be cleaned or replaced by the operator.

It is, therefore, an object of this invention to provide a filter which removes dust particles from the ventilation air of computer systems and disk drives while allowing maximal air flow through the system.

It is a further object of this invention to provide a filter for an electronics enclosure that can be easily removed and cleaned by the user.

These and other objects will become apparent from the following description of the preferred embodiment taken in conjunction with the following drawings, although variations and modifications may be effected without departing from the spirit and scope of the novel concepts of the disclosure.

BRIEF DESCRIPTION OF THE FIGURES OF THE DRAWINGS

FIG. 1 is an exploded perspective view of the present invention.

FIG. 2 is a partial top view sectional drawing of the filter element portion of the enclosure.

FIG. 3 is a partial rear view of the front panel of the present invention.

DETAILED DESCRIPTION OF THE INVENTION

The preferred embodiment of the invention is now described in detail. Referring to the drawings, like numbers indicate like parts throughout the views.

Specifically referring to FIG. 1, the preferred embodiment of the present invention includes a cabinet 1, a front panel 2, and a filter unit 3. The front panel 2 may be fastened to the cabinet 1 using any conventional method (such as snap-in stud fasteners or screws). The cabinet 1 has an air hole 11 which is used as an air intake. The front panel 2 has a plurality of holes 21 which are also used for the same purpose.

As seen in FIG. 2, the inside of the front panel 2 is placed in relation to the cabinet 1 such that the air hole 11 on the cabinet 1 and the plurality of holes 21 on the front panel 2 form an air circulation path 5. A sufficient number of holes 21 must be used to ensure adequate air flow. A fan 14 draws air into the cabinet 1 through the air hole 11. Thus, outside air will pass in sequence through the air holes 21 on the front panel 2 via the air circulation path 5 through the hole 11 on the cabinet 1 and then be forced into the inside of the cabinet 1 by the fan 14, forming a ventilating air current.

The cabinet 1 has two spacing blocks 12, one on each side of the air circulation path 5. The distance between the front edges of the spacing blocks 12 and the inner side wall of the front panel 2 provides a gap 4 just wide enough to insert the filter unit 3.

Returning to FIG. 1, the filter unit 3 is seen in relation to the cabinet 1 and the front panel 2. The front edges of the spacing blocks 12 are set such that they form a seal with the outer periphery of the filter unit 3. This ensures that all air entering the hole 11 passes through the filter unit 3 and enters the cabinet 1 without any leakage on the sides.

Referring to FIG. 1, the filter unit 3 may be manufactured from a flexible plastic. Its front area is a light frame 38 which supports a dust collecting filter element 35 which is affixed to the frame 38. The filter element 35 can be made out of a netted weave, fiber cotton, sponge, or any filtering material that will remove dust particles while allowing sufficient air flow velocity when used in combination with the cooling fan 14 in the computer. In an alternative embodiment, the filter element 35 is disposable. Attached to the filter unit 3 are two flexible fingers 33 ending in retaining surfaces 34. The front panel 2 has two corresponding protruding guides 23 which end at the bottom such that the retaining surfaces will extend under the bottom of said guides when the filter is fully inserted, such that the filter will be held in place. To remove the filter unit 3 for easy cleaning, the user pulls the filter unit 3 straight upward. To ensure easy removal, the holding surfaces 34 should have a curved or angled upper surface.

As seen in FIG. 1, the upper part of the filter unit 3 has a grip part 31 which allows the user to remove the filter unit 3 by pulling upward. In order to increase the surface frictional force of the grip part 31 slip-proof round granules 32 are added to the surface. In an alternative embodiment, friction may be maintained on the filter unit by using a concave slot for the filter unit 3.

For ease of use, it is best to place the filter unit 3 in the front of the electronics enclosure. However, in some applications it may be optimal to place the filter unit at other locations on the enclosure.

The above embodiments are given as illustrative examples and are not intended to impose any limitations on the invention. It will be readily appreciated that many deviations may be made from the specific embodiments disclosed in this specification without departing from the invention. Accordingly it is intended to cover all such modifications as within the scope of this invention.

What is claimed is:

1. An electronics enclosure, comprising:

a. an enclosure defining a circulation air intake opening;

b. at least one guide disposed adjacent said air intake opening;

c. a filter unit having a filter element in an air sealing relationship with said enclosure, said filter element removably disposed adjacent said air intake opening so that air drawn into said enclosure through said air intake opening by a fan passes through said filter element; and d. at least one flexible finger extending from said filter unit and ending in a retaining surface, each engageable with at least one, of said guides, said flexible finger being flexible to allow said retaining surface to disengage said guide when said filter unit is removed from said enclosure.

2. The electronics enclosure of claim 1 wherein said filter unit comprises:

a. a frame supporting said filter element; and b. gripping means, attached to said frame, for gripping said filter unit while removing it from the enclosure.

3. The electronics enclosure of claim 1 wherein said filter element comprises a netted weave.

4. The electronics enclosure of claim 1 wherein said filter element comprises fiber cotton.

5. The electronics enclosure of claim 1 wherein said filter element comprises sponge.

* * * * *